(12) United States Patent
Ohmoto et al.

(10) Patent No.: US 6,328,845 B1
(45) Date of Patent: Dec. 11, 2001

(54) PLASMA-PROCESSING METHOD AND AN APPARATUS FOR CARRYING OUT THE SAME

(75) Inventors: Yutaka Ohmoto, Hikari; Ryooji Fukuyama; Makoto Nawata, both of Kudamatsu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/214,766

(22) Filed: Mar. 18, 1994

(30) Foreign Application Priority Data

Mar. 18, 1993 (JP) .................................................... 5-058419
Dec. 28, 1993 (JP) .................................................... 5-334955

(51) Int. Cl.$^7$ ............................................. H01L 21/3065
(52) U.S. Cl. ......................... 156/345; 438/719; 438/738
(58) Field of Search ................................. 156/345, 643.1, 156/646.1; 204/298.38, 298.37, 192.32, 192.37; 438/719, 738

(56) References Cited

U.S. PATENT DOCUMENTS

| | | | |
|---|---|---|---|
| 4,585,516 | * | 4/1986 | Corn et al. .......................... 156/643 |
| 4,808,258 | * | 2/1989 | Otsubo et al. ...................... 156/643 |
| 4,844,767 | * | 7/1989 | Okudaira et al. ................... 156/345 |
| 4,985,114 | * | 1/1991 | Okudaira et al. ................... 156/643 |
| 5,223,457 | * | 6/1993 | Mintz et al ..................... 156/643 X |
| 5,242,539 | * | 9/1993 | Kumihashi et al. ................. 156/643 |
| 5,242,561 | * | 9/1993 | Sato ............................ 204/192.32 X |
| 5,259,922 | * | 11/1993 | Yamano et al. ..................... 156/643 |
| 5,310,452 | * | 5/1994 | Doki et al. .......................... 156/643 |

* cited by examiner

Primary Examiner—Gregory Mills
(74) Attorney, Agent, or Firm—Antonelli, Terry, Stout & Kraus, LLP

(57) ABSTRACT

A plasma-etching apparatus is capable of etching a film of a workpiece with a plasma produced in an evacuated etching chamber at a high etch selectivity relative to an underlying film or a resist film. The frequency of a RF bias voltage applied to a sample table by a RF power source is adjusted so that the ion energy of the plasma is distributed in a saddle-peak energy distribution pattern. The film is etched at a high etch selectivity relative to a material having a threshold ion energy.

6 Claims, 12 Drawing Sheets

PLASMA-PROCESSING METHOD AND AN APPARATUS FOR CARRYING OUT THE SAME

BACKGROUND OF TEE INVENTION

1. Field of the Invention

The present invention relates to a plasma-processing method and an apparatus for carrying out the same and, more particularly, to a plasma-processing method suitable for plasma-etching a workpiece, such as a film coating a semiconductor substrate, and an apparatus for carrying out the same.

2. Description of the Related Art

Etching techniques that vary the frequency of a RF bias voltage (radio-frequency bias voltage) to be applied to a substrate, such as a semiconductor wafer, when etching a film formed over the surface of a substrate are disclosed, for instance, in Japanese Patent Laid-open (Kokai) Nos. 4-27119 and 4-14853. The technique disclosed in Japanese Patent Laid-open (Kokai) No. 4-27119 employs frequency control in combination with RF bias power control because it is difficult to control ion energy only by RF bias power control. The specification of this known invention describes that there is the tendency that ion energy decreases with the increase of the bias frequency, and vice versa. Although effective in controlling anisotropy and reducing damages in the substrate, this known technique takes nothing into consideration about etch selectivity, i.e., the ratio of an etching rate with a material to be etched to the etching rate with an under layer under a layer of the material to be etched, and does not show any method of setting a frequency to provide a high etch selectivity.

The technique disclosed in Japanese Patent Laid-open (Kokai) No. 4-14853 utilizing a phenomenon that an etching reaction is caused principally by radicals when the frequency of the RF bias is high or principally by ions when the frequency of the RF bias is low uses an RF bias having a high frequency for etching a metallic suicide layer having a high melting point and uses a RF bias having a low frequency for etching a polycrystalline silicon layer. It is described on p. 7, left col. of the specification of Japanese Patent Laid-open (Kokai) No. 4-14853, in connection with process conditions for etching a polycrystalline silicon layer, that a high etch selectivity was obtained in an embodiment when the frequency of the RF bias was 800 KHz. However, there is no discussion about a method of setting a frequency that provides a maximum etch selectivity under various process conditions and no reference is made to an etching method that realizes a high etch selectivity at a high etching rate.

SUMMARY OF THE INVENTION

Accordingly, it is an object of the present invention to provide an etching method capable of etching an object film at a high etch selectivity relative to an under layer such as a ground film, a resist film and a substrate, and an apparatus for carrying out the etching method.

Another object of the present invention is to provide an etching method capable of etching one of two kinds of materials at an etching rate higher than that at which the other material is etched, and an apparatus for carrying out the etching method.

With the foregoing objects in view, the present invention employs, taking into consideration a fact that different materials differ from each other in the dependence of etching rate on ion energy, an ion generator that generates first ions that etch one of two materials of a sample placed in a processing chamber and do not etch the other material of the sample and second ions that etch both the materials of the sample in an energy distribution in which both the first and second ions are abundant.

The ion generator may have, for instance, an adjuster of a variable RF bias frequency type that adjusts the RF bias frequency so that the foregoing energy distribution is established.

BRIEF DESCRIPTION OF THE INVENTION

The above and other objects, features and advantages of the present invention will be become more apparent from the following description taken in connection with the accoupanying drawings, in which.

Figure 3A:
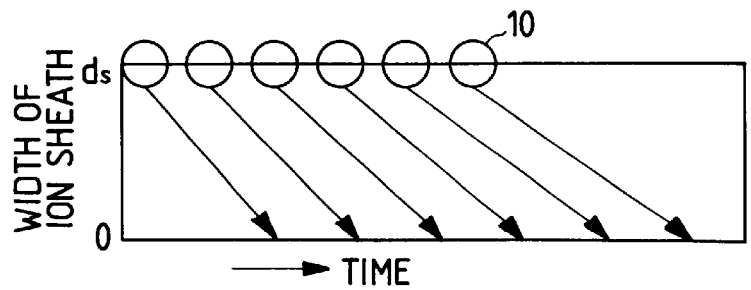
Figure 3B:
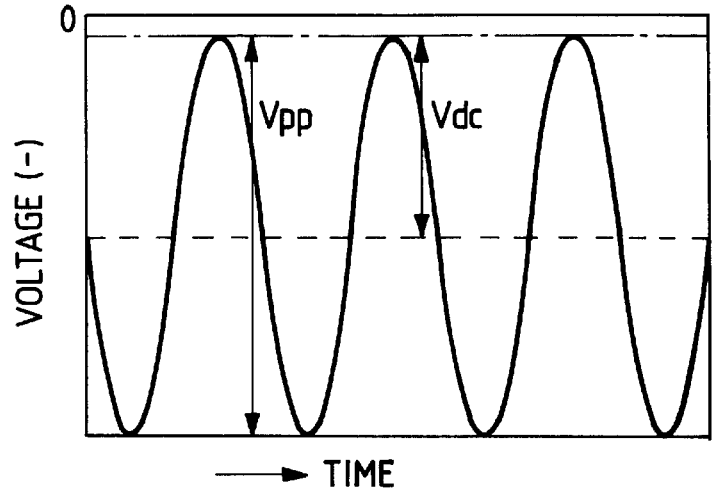
Figure 3C:
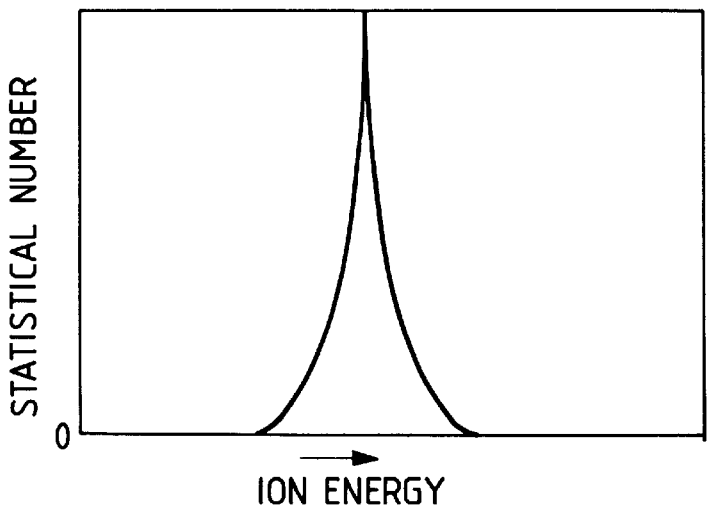
Figure 4A:
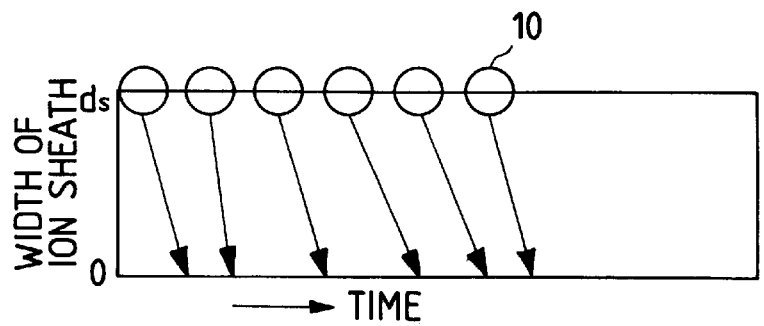
Figure 4B:
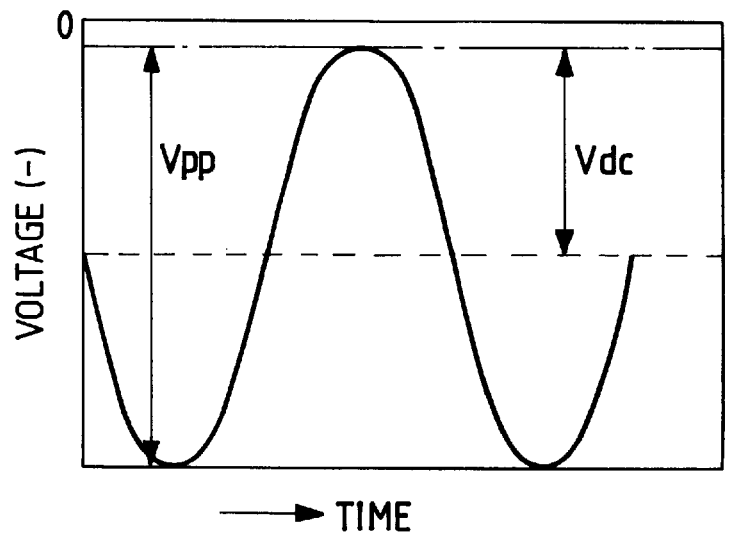
Figure 4C:
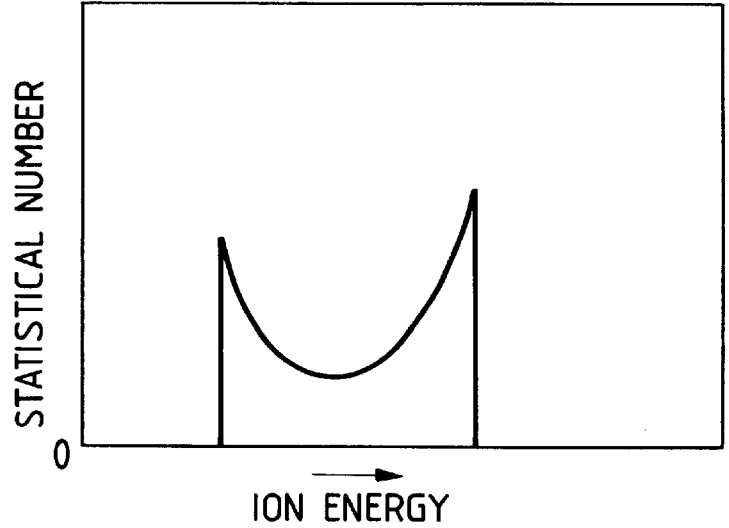
Figure 5A:
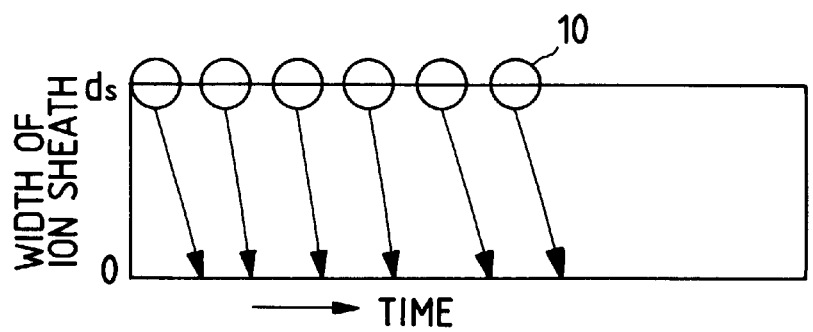
Figure 5B:
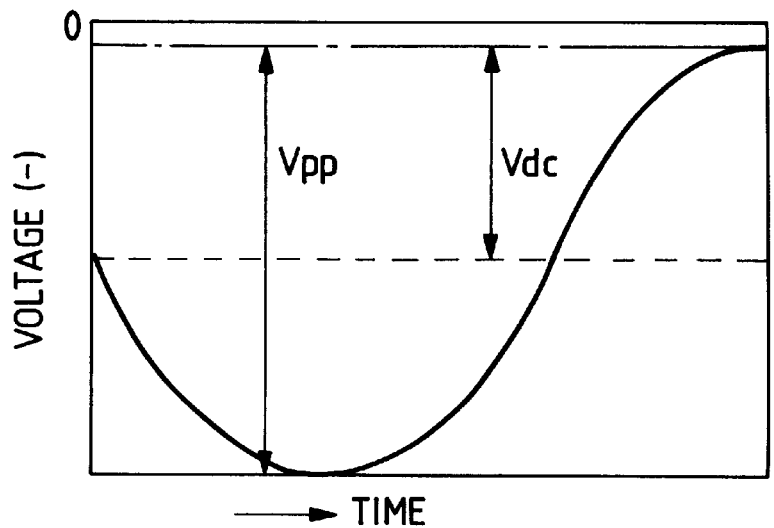
Figure 5C:
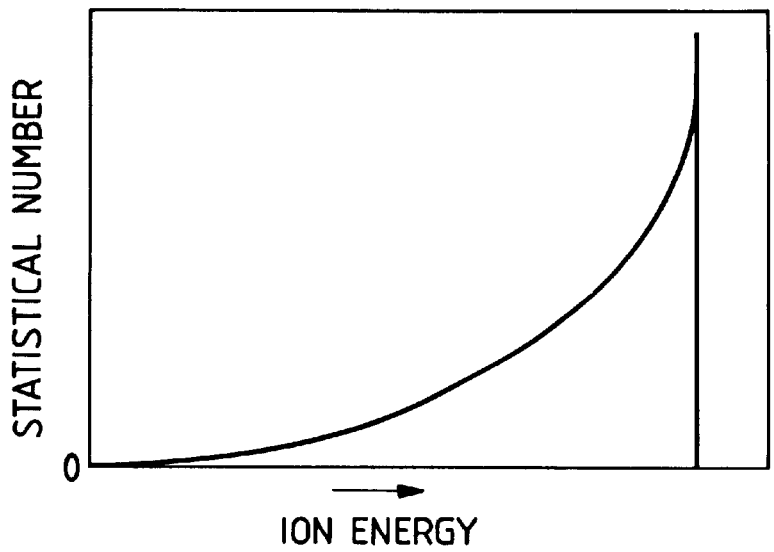
Figure 6:
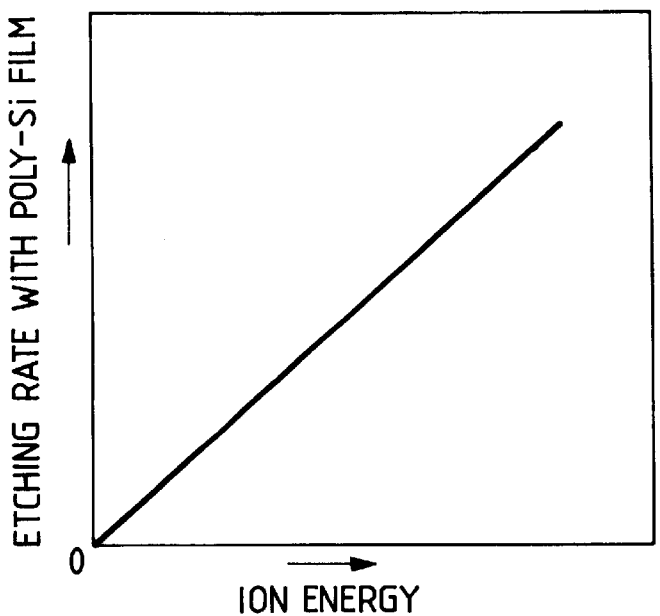
Figure 7:
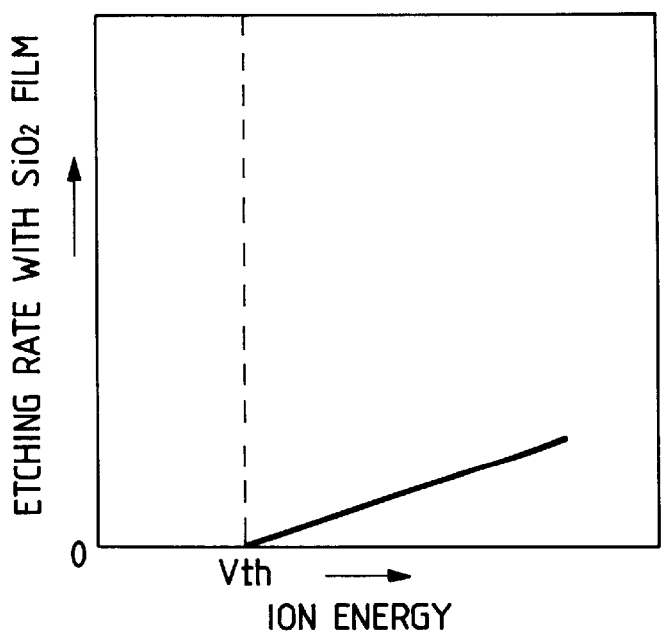
Figure 8:
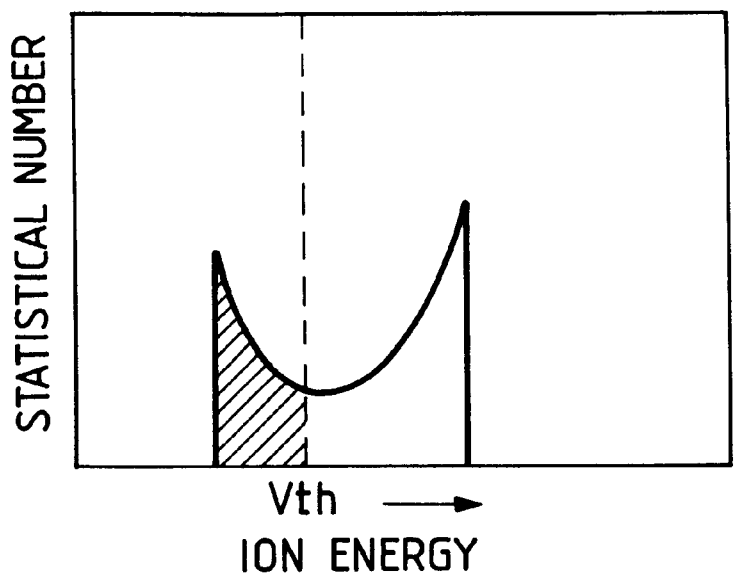
Figure 11:
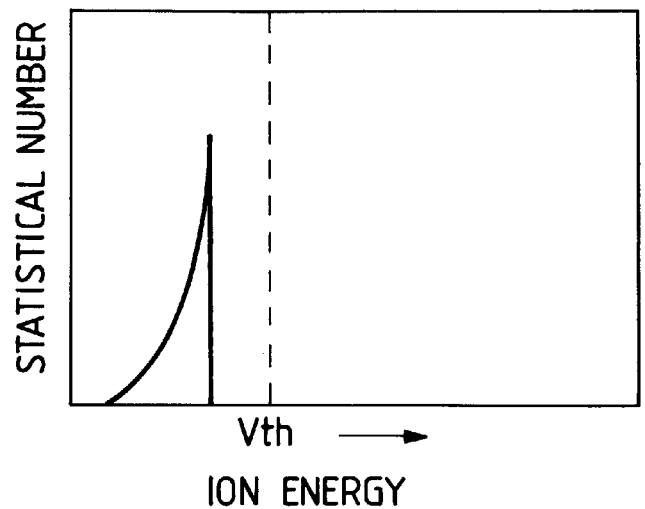
Figure 12:
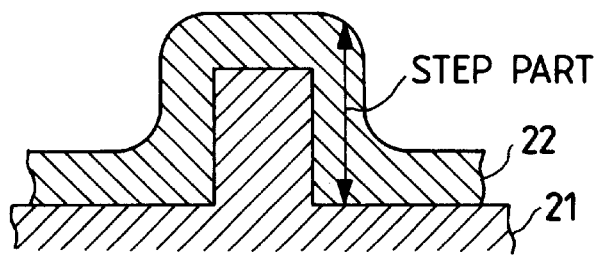
Figure 13:
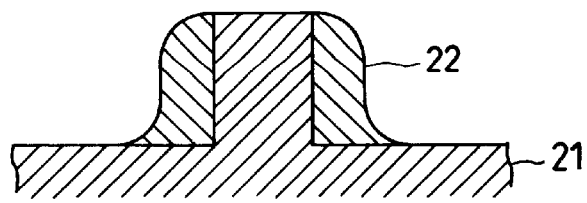
Figure 14:
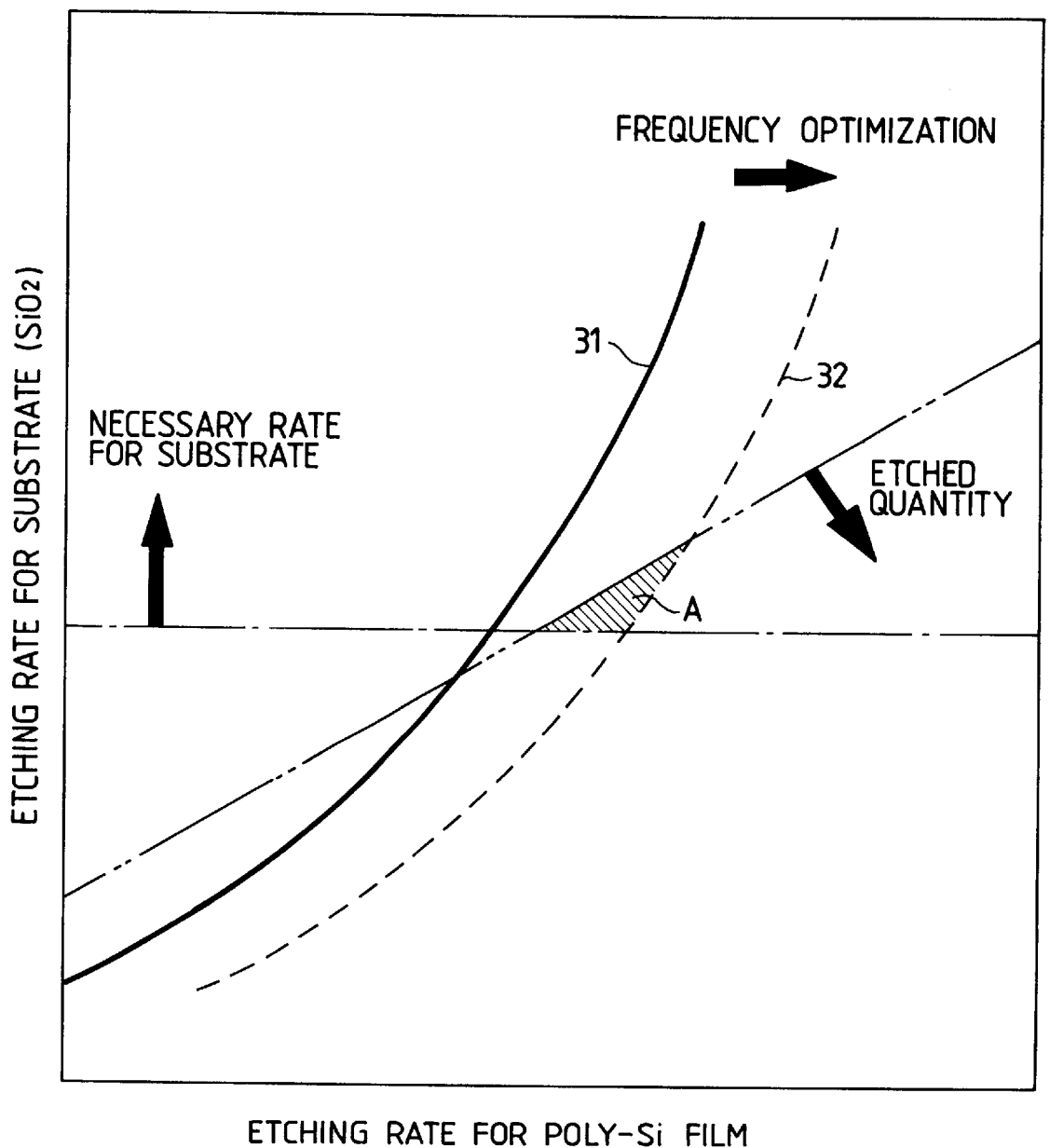
Figure 15:
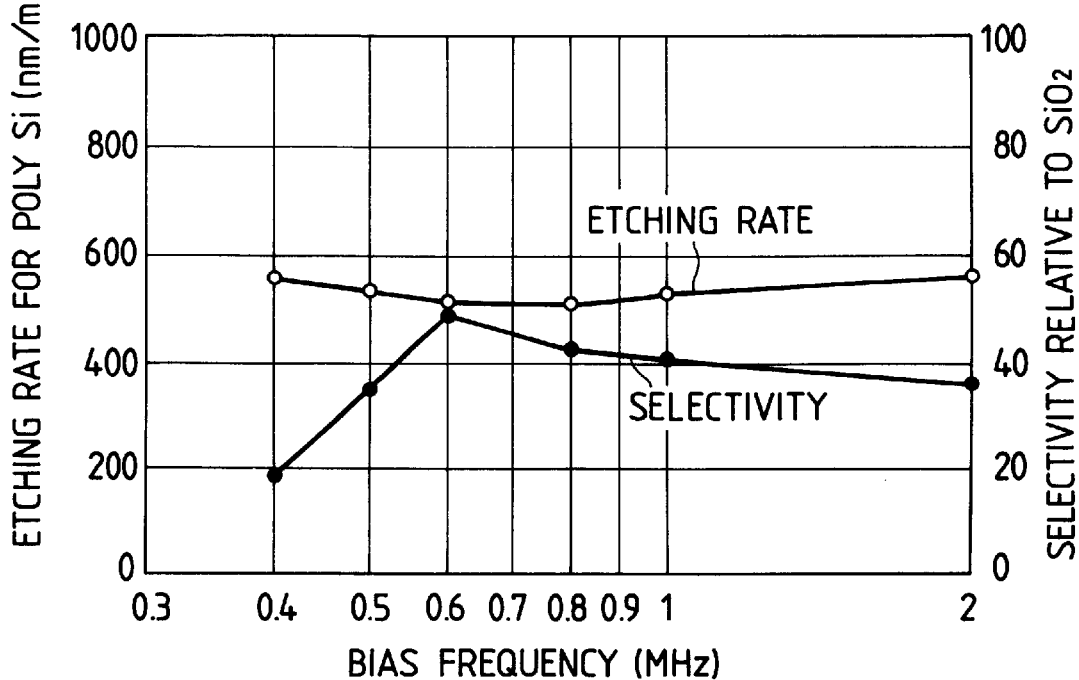
Figure 16:
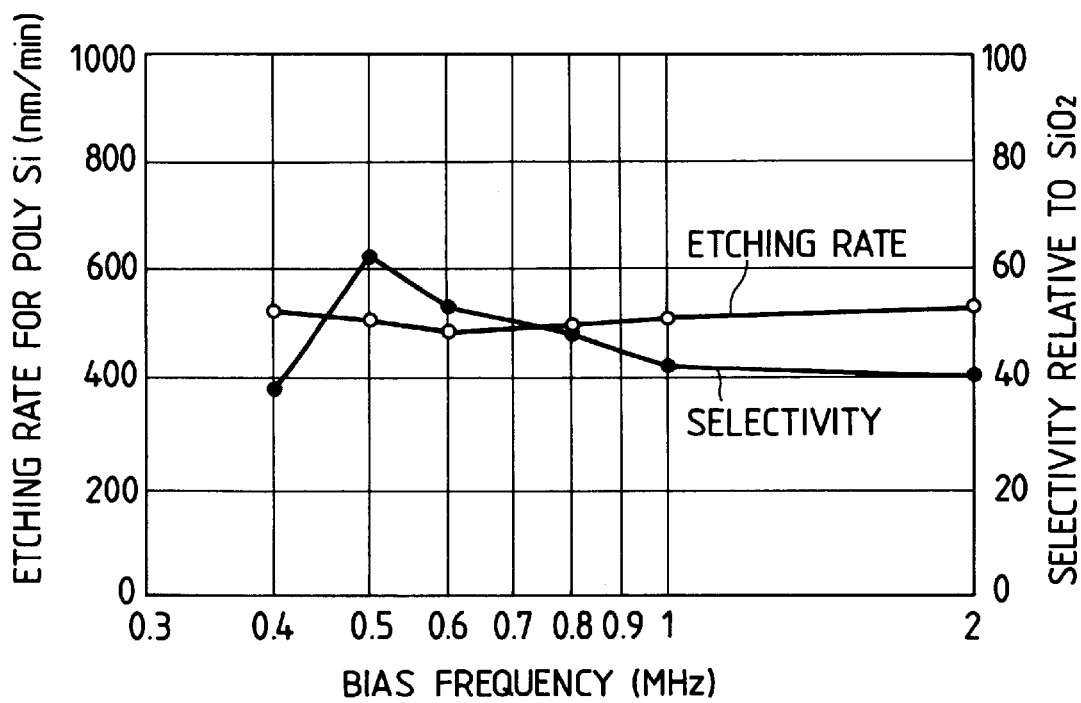
Figure 17A:
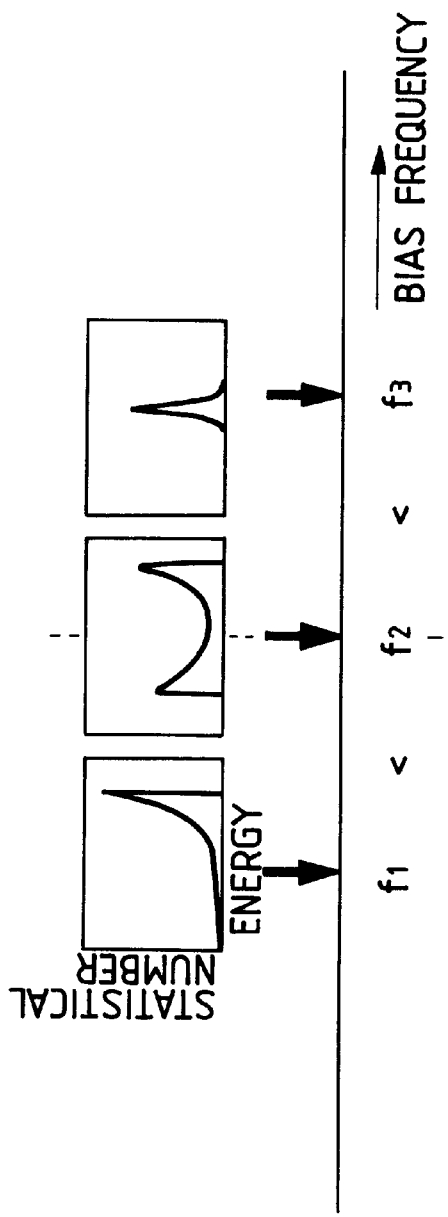
Figure 17B:
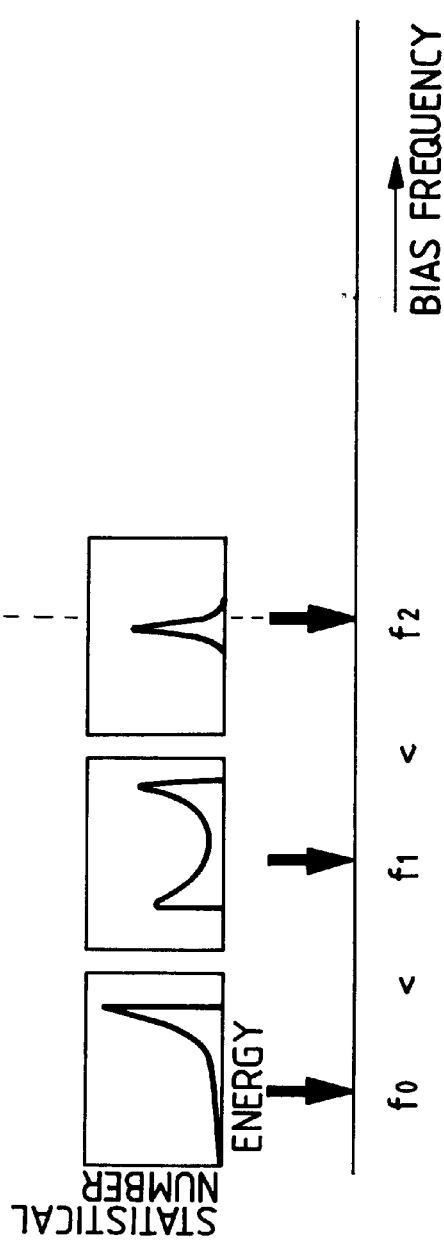
Figure 18:
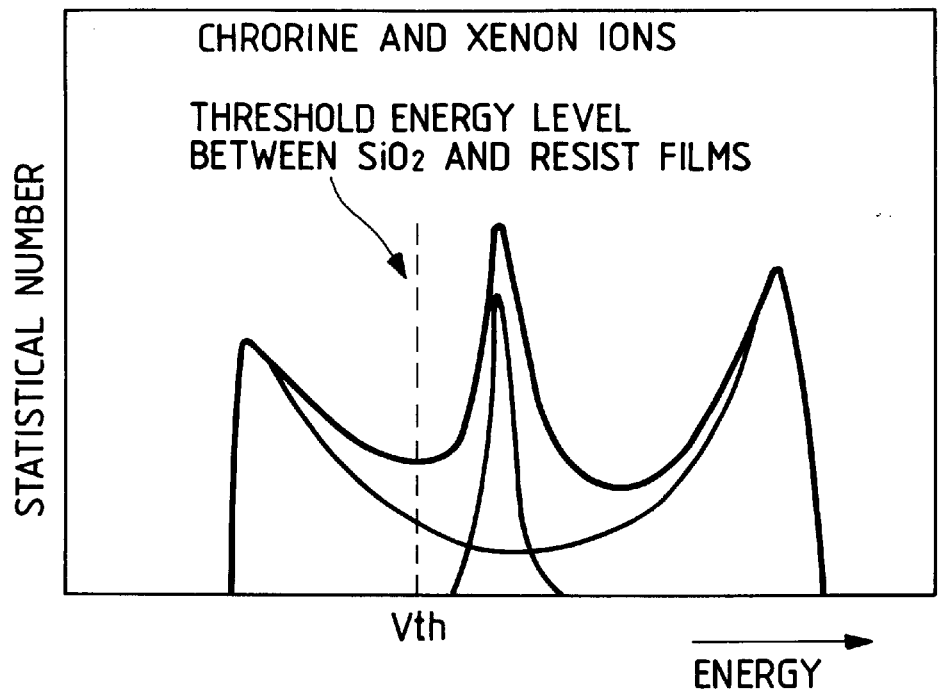

FIGS. 3(a), 3(b) and 3(c) are graphs showing an ion energy distribution pattern when the bias frequency is so high that ions are unable to cross an ion sheath in one cycle time of the bias voltage;

FIGS. 4(a), 4(b) and 4(c) are graphs showing an ion energy distribution pattern when the bias frequency is determined so that the time necessary for ions to cross an ion sheath is in the range of about 20% to 80% of one cycle time of the bias voltage;

FIGS. 5(a), 5(b) and 5(c) are graphs showing an ion energy distribution pattern when the bias frequency is determined so that ions are able to cross an ion sheath in a time corresponding to 20% of one cycle time of the bias voltage or below;

FIG. 6 is a graph showing the dependence of etching rate with a polycrystalline silicon film on ion energy;

FIG. 7 is a graph showing the dependence of etching rate with a silicon dioxide film on ion energy;

FIG. 8 is a graph showing an ion energy distribution pattern;

FIGS. 9(a), 9(b), 9(c), 9(d) and 9(e) are graphs showing calculated ion energy distribution patterns for different frequencies;

FIG., 10 is a graph showing an ion energy distribution pattern;

FIG. 11 is a graph showing an ion energy distribution pattern;

FIG. 12 is a longitudinal sectional view of a stepped workpiece;

FIG. 13 is a longitudinal sectional view of assistance in explaining an over-etched stepped workpiece;

FIG. 14 is a graph showing possible range of etching conditions for different materials;

FIG. 15 is a graph showing the dependence of etching rate with a polycrystalline silicon film and silicon dioxide film selection ratio on bias frequency when chlorine gas is used as a processing gas;

FIG. 16 is a graph showing the dependence of etching rate with a polycrystalline silicon film and silicon dioxide film selection ratio on bias frequency when hydrogen bromide gas is used as processing gas;

FIGS. 17(a) and 17(b) are diagrams showing the energy distribution patterns of chlorine ions and xenon ions;

FIG. 18 is a diagram showing the energy distribution pattern of mixed ions; and

Figure 19:
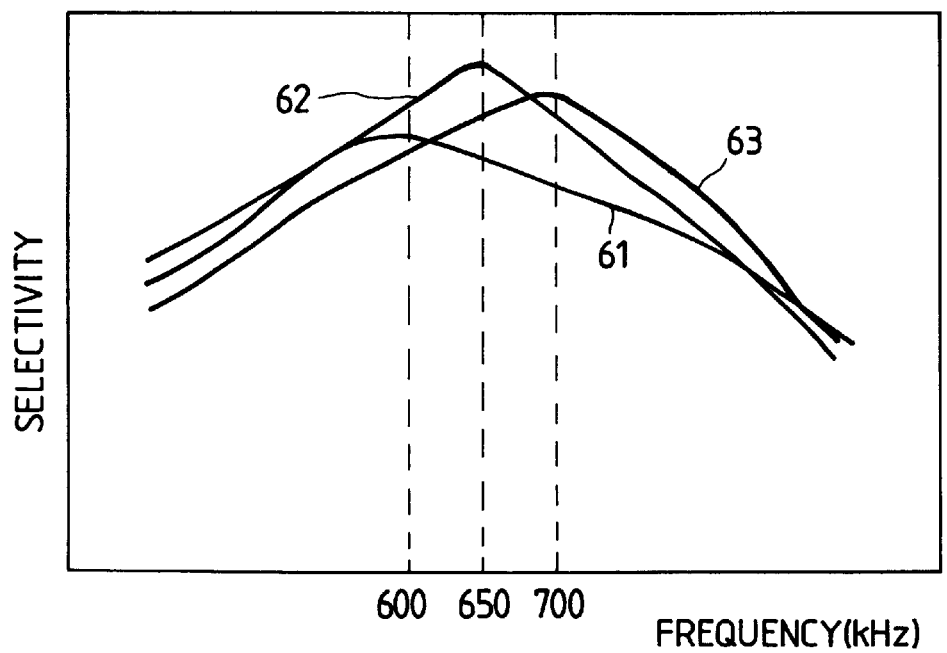

FIG. 19 is a graph showing the relation between selection ratio and RF bias frequency.

DESCRIPTION OF THE PREFERRED EMBODIMENTS

Figure 1:
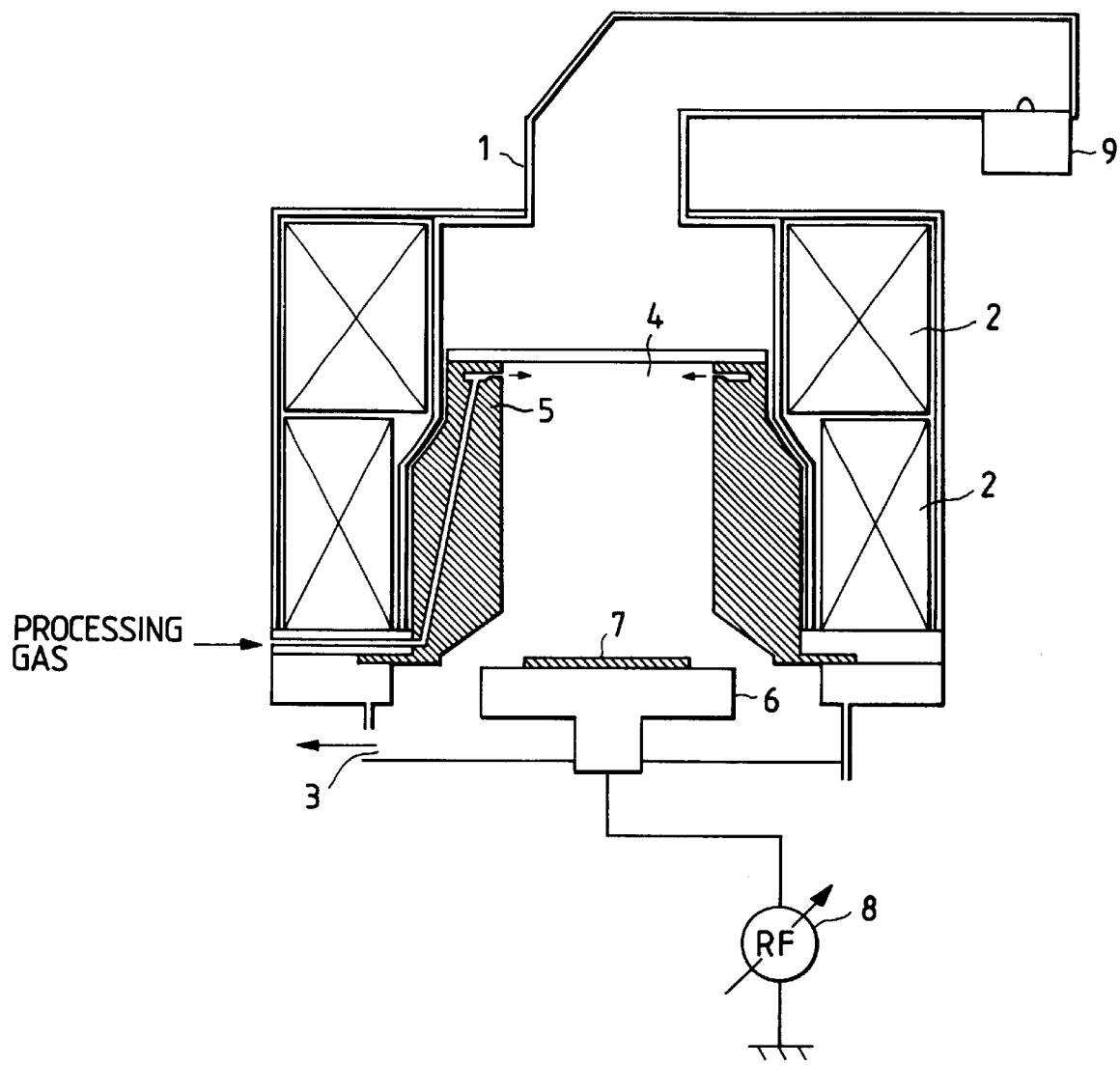
FIG. 1 is a sectional view of an etching apparatus in a preferred embodiment according to the present invention.

Referring to FIG. 1 showing an etching apparatus in a preferred embodiment according to the present invention, the etching apparatus produces a plasma of a processing gas supplied through a supply passage 5 into an evacuated processing chamber 4 from which gasses are removed through a discharge passage 3 by the mutual actions of an electric field created by a microwave generated at a magnetron 9 and propagated through a waveguide 1, and a magnetic field created by a solenoid coils 2, and etches a semiconductor wafer 7 mounted on a sample table 6 with the plasma. A variable-frequency RF power supply 8 is connected to the sample table 6 to apply RF power of a desired frequency to the sample table 6. When etching a polycrystalline silicon film formed on a $SiO_2$ substrate by using chlorine gas, for instance, the pressure in the processing chamber 4 is 5 mtorr.

First, the dependence of ion energy distribution pattern on the voltage or such of the power supply 8 will be described.

Figure 2:
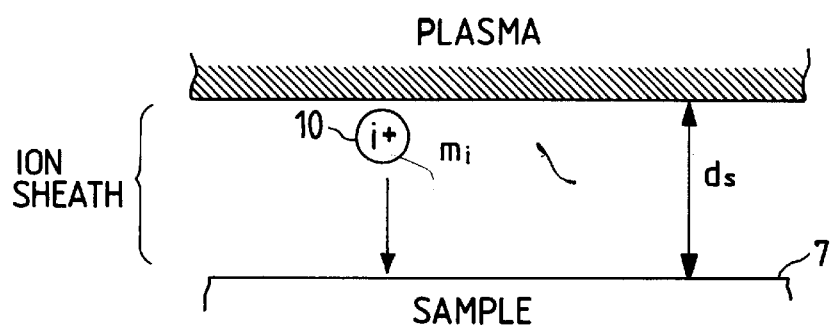
FIG. 2 is a diagrammatic view of assistance in explaining the movement of ions in an ion sheath unit.

Referring to FIG. 2, an ion 10 is accelerated in an ion sheath of a width $d_s$ by a bias voltage applied to the semiconductor wafer 7. The ion 10 absorbs energy in the ion sheath and impinges on the semiconductor wafer 7 and transfers the energy to the semiconductor wafer 7 to promote etching. The magnitude of the energy is dependent on the phase of the RF bias voltage applied to the semiconductor wafer 7 at the time of start of the ion from the end of the ion sheath. When the ion energy is estimated statistically, the ion energy is distributed typically in three energy distribution patterns depending on the width $d_s$ of the ion sheath, the mass $m_i$ of the ions, bias voltage Vpp and self-bias voltage $V_{dc}$. For example, when the width $d_s$ of the ion sheath, the mass $m_i$ of ions, self-bias voltage $V_{dc}$ and bias voltage $V_{pp}$ are fixed and the frequency f of the bias voltage (hereinafter, referred to as "bias frequency f") is varied, the ion energy is distributed in a first energy distribution pattern having a peak corresponding to the self bias voltage $V_{dc}$ as shown in FIG. 3(c) if the bias frequency f is so high that ions are unable to cross the ion sheath in one cycle time of the bias voltage as shown in FIGS. 3(a) and 3(b).

The ion energy is distributed in a second energy distribution pattern having peaks for the lowest and the highest ion energy, i.e., the so-called saddle-peak distribution pattern, as shown in FIG. 4(c) when the bias frequency f is determined so that the time necessary for ions to cross the ion sheath is in the range of about 20% to about 80% of one cycle time of the bias voltage as shown in FIGS. 4(a) and 4(b).

The ion energy is distributed in a third energy distribution pattern having a peak at the highest ion energy corresponding to $V_{dc}+½V_{pp}$ as shown in FIG. 5(c) when the bias frequency f is so low that ions are able to cross the ion sheath in a time corresponding 20% of one cycle time of the bias voltage or below and to reach the surface of the semiconductor wafer.

In other words, when process conditions are given, the distribution of ion energy can be varied in three different energy distribution pattern by varying the bias frequency.

The dependence of etch selectivity on the ion energy distribution will be described hereinafter with reference to an etching process for etching a polycrystalline silicon film (hereinafter, referred to as "p—Si film").

Generally, a p—Si film is underlaid with a silicon dioxide film (hereinafter, referred to as "$SiO_2$ film"). FIG. 6 shows the variation of the etching rate with a p—Si film with ion energy and FIG. 7 shows the variation of the etching rate with a $SiO_2$ film with ion energy. As is evident from FIGS. 6 and 7, the etching rate with a p—Si film increases linearly from zero as the ion energy increases from zero, and the etching rate with a $SiO_2$ film remains zero while the ion energy is not higher than a threshold ion energy $V_{th}$ and starts increasing linearly from zero as the ion energy increases from the threshold ion energy $V_{th}$.

When the bias frequency f is determined so that the ion energy is distributed in a saddle-peak ion energy distribution pattern as shown in FIG. 4(c) when etching the p—Si film, all the ions contribute to etching. If the bias frequency f is determined so that the threshold ion energy $V_{th}$ corresponds substantially to the middle of the saddle-peak ion energy distribution pattern as shown in FIG. 8, the ion energy in the hatched area is ineffective energy which does not contribute to etching the $SiO_2$ film and the etching rate with the $SiO_2$ film is comparatively low, so that the etch selectivity is large. However, since the ion energy in the blank area in FIG. 8 contributes to etching the $SiO_2$ film, the etching rate can be maintained on a comparatively high level.

FIGS. 9(a), 9(b), 9(c), 9(d) and 9(e) show the frequency-dependence of ion energy distribution determined by calculation using the following expressions.

$$d_s=(qV_{pp}/2md)(1/2\pi f)\{t\cdot\cos\downarrow_n(1/2\pi f)\cdot\sin(2\pi ft+\theta_n)\cdot\sin\theta_n\}+(-qV_{dc}/2md)-t^2 \quad (1)$$

$$v=(qV_{pp}/2md)(1/2\pi f)\{-\cos(2\pi ft+\theta_n)+\cos\theta_n\}+(-qV_{dc}/md)\cdot t \quad (2)$$

$$E_i=mv^2/2q \quad (3)$$

where $\theta_n$ is the phase of the voltage at the time when the ions starts from the end of the ion sheath, v is the velocity of the ion at the arrival of the same at the surface of the semiconductor wafer, $E_i$ is the energy of the ion at the arrival of the same at the surface of the semiconductor wafer, q is the electric charge of the ion, $d_s$ is the width of the ion sheath, $m_i$ is the mass of the ion, $V_{pp}$ is bias voltage, and $V_{dc}$ is self bias voltage. In the calculation $D_s=5$ mm, $m_i=5.9\times10-26$ (chlorine ion), $V_{pp}=200$ V, $V_{dc}=-100$ V were used.

Figure 9A:
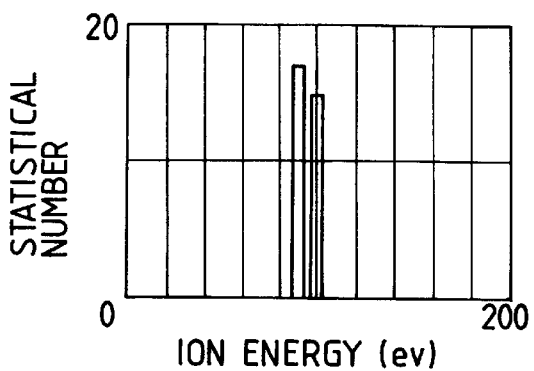
Figure 9B:
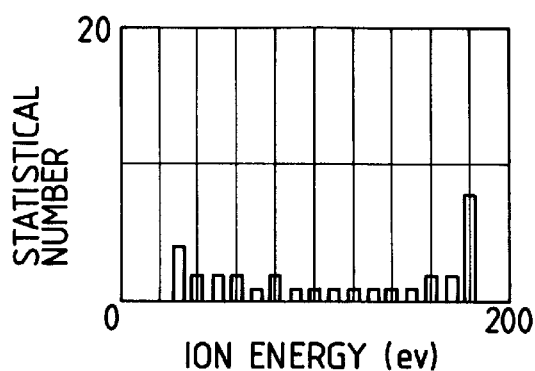
Figure 9C:
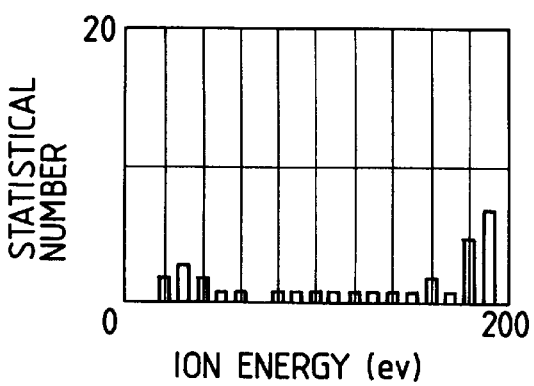
Figure 9D:
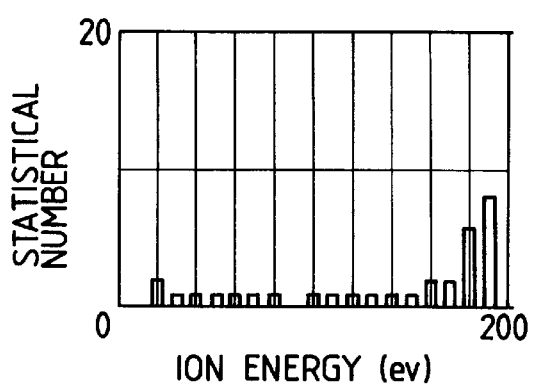
Figure 9E:
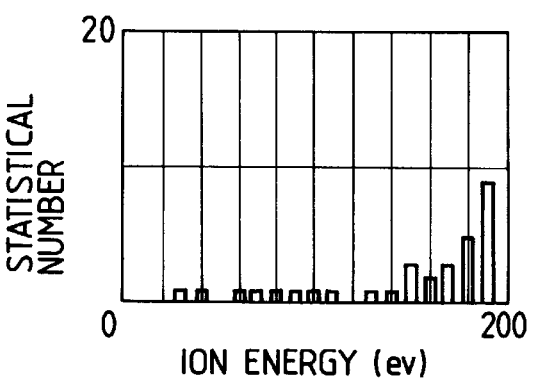

When the frequency of the RF bias voltage was 13.56 MHz, a single peak appears when the ion energy $V_{dc}=100$ V as shown in FIG. 9(a). When the frequency of the RF bias voltage is in the range of 600 kHz to 1 MHz, the ion energy is distributed in saddle-peak energy distribution patterns as shown in FIGS. 9(b), 9(c) and 9(d). When the frequency of the RF bias voltage is 400 kHz, a single peak appears at $V_{dc}+1/2V_{pp}=200$ V as shown in FIG. 9(e), FIGS. 9(b), 9(c) and 9(d) are ion energy distribution patterns respectively for 1 MHz, 800 kHz and 600 kHz. From FIGS. 9(a) to 9(e) it is expected that a bias frequency that provides a large etch selectivity is in a frequency range of 600 kHz to 1 MHz.

Figure 10:
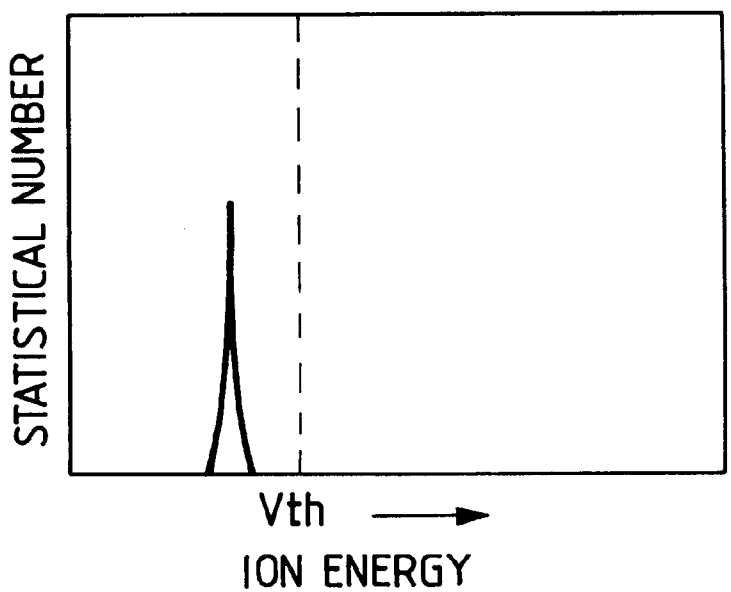

Energy distribution patterns each having a peak in an ion energy region below the threshold ion energy $V_{th}$ as shown in FIGS. 10 and 11 also provide a large etch selectivity. When ion energy is distributed in the energy distribution patterns shown in FIGS. 10 and 11, none of the ions contributes to etching the $SiO_2$ film, namely, the etching rate with the $SiO_2$ film is zero and the etch selectivity is infinity. The energy distribution pattern shown in FIG. 10 appears when the frequency of the bias voltage $V_{pp}$ is, for example, as high as 13.56 MHz, and the self bias voltage $V_{dc}$ is low.

The energy distribution pattern shown in FIG. 11 appears when the bias voltage $V_{pp}$ is low and has a frequency, for example, as low as 400 kHz. However, an infinite etch selectivity is not necessarily industrially useful for the following reasons.

Referring to FIG. 12, a substrate 21 has a projection and the surface of the substrate 21 is coated with a film 22. When the surface of the film 22 is coated with a mask and the film 22 is subjected to etching to remove part of the film 22 around the projection by etching, part of the film 22 covering the side surfaces of the projection will remain after part of the film 22 covering the upper surface of the projection has been removed as shown in FIG. 13. This part of the film 22 covering the side surfaces of the projection must be removed by over-etching. When controlling the morphology by making a product material produced by the etching reaction of the substrate 21 adhere to the side surfaces of the projection to project the side surfaces from the etching action of radicals, the substrate 21 must be etched at an etching rate higher than a given etching rate. In these cases, an infinite etch selectivity is unnecessary. However, in the former case, the quantity of part of the substrate 21 which will be removed before the part of the film 22 covering the side surfaces of the projection is removed completely (referred to as "etched quantity") must be restricted to a quantity below a certain value and, in the latter case, the substrate 21 must be etched at an etching rate higher than a certain etching rate. The etched quantity of the substrate 21 is expressed by the following expression.

(Etched quantity)=(Etching rate with the substrate)×(Height of the projection)/(Etching rate with the film)  (4)

To reduce the etched quantity of the substrate 21 when the etching rate with the substrate 21 is given, the etching rate with the film 22 must be increased. In such a case, it is effective to use a bias voltage having a frequency that realizes a saddle-peak energy distribution pattern.

A typical mode capable of satisfying expression (4) will be described with reference to FIG. 14. In FIG. 14, the etching rate with the p—Si film is measured on the horizontal axis, and the etching rate With the $SiO_2$ film is measured on the vertical axis. There is not any point on an etching characteristic curve 31 for an etching condition in which an optimum frequency is not used that lies in an area meeting expression (4), i.e., an area A between a necessary substrate etching rate indicated by an alternate long and short dash line and an etched quantity indicated by an alternate long and two short dash line, and hence desirable etching cannot be achieved. Etching conditions indicated by some points on an etching characteristic curve 32 formed by changing the bias frequency to shift the etching characteristic curve 31 are included in the area A and hence those conditions enables satisfactory etching.

The etch selectivity relative to the resist film can be improved by selectively determining the bias frequency taking the energy threshold $V_{th}$ for the resist film into consideration.

Etching conditions for etching a p—Si film underlaid with a $SiO_2$ film by using chlorine gas as a processing gas by the etching apparatus shown in FIG. 1, are 1 kw in the power of the microwave, 70 W in the RF power, and 5 mtorr in the pressure in the etching chamber 4.

FIG. 15 shows the dependence of the etching rate with p—Si and the p—Si etch selectivity relative to $SiO_2$ on the bias frequency. When measuring the p—Si etching rate and the p—Si etch selectivity relative to $SiO_2$, the bias frequency was varied in the range of 400 kHz to 2 MHz. The p—Si etching rate is scarcely affected by the bias frequency. A minimum $SiO_2$ etching rate of 520 nm/min and a maximum p—Si etch selectivity relative to $SiO_2$ of 50 appeared at a bias frequency of 600 kHz. Since the p—Si etch selectivity relative to $SiO_2$ is 40 or above in a bias frequency range of 550 kHz to 1 MHz, it is desirable to use a bias frequency in that bias frequency range to satisfy both etched quantity and etching morphology. An optimum bias frequency is 600 kHz. The etching rate with the resist film, not shown, had the same tendency.

Experimental etching operation was carried out under the same etching conditions as the foregoing etching conditions by using the same etching apparatus, except that hydrogen bromide gas was used as a processing gas instead of chlorine gas.

FIG. 16 shows the dependence of the p—Si etching rate and the p—Si etch selectivity relative to $SiO_2$ on the bias frequency. The p—Si etching rate was scarcely affected by the bias frequency. A minimum $SiO_2$ etching rate and a maximum p—Si etch selectivity relative to $SiO_2$ appeared at a bias frequency of 500 kHz. Since bromine ions are principal ions for etching when hydrogen bromide is used as a processing gas and the mass of bromine ions is greater than that of chlorine ions and the energy distribution pattern shown in FIG. 8 is shifted toward lower bias frequency, the bias frequency, i.e., 500 kHz, at which the minimum $SiO_2$ etching rate and the maximum p—Si etch selectivity relative to $SiO_2$ appear is lower than the corresponding bias frequency, i.e., 600 kHz when chlorine gas is used. In this case, it is desirable to use a bias frequency in the range of 450 kHz to 600 kHz, in which the p—Si etch selectivity relative to $SiO_2$ is 50 or above. Therefore, 500 kHz is an optimum bias frequency.

Study will be made of the distribution of the respective quantities of energy of ions accelerated by a bias voltage and falling on a wafer when an etching gas consisting of chlorine gas as a principal gas and xenon gas as an additive gas is used and the pressure in the etching chamber 4 is 5 mtorr. The bias frequency is varied in a range below 1 MHz. As typically shown in three graphs in FIG. 17(a), the energy distribution pattern varies with the bias frequency. The frequencies $f_1$, $f_2$ and $f_3$ respectively corresponding to the energy distribution patterns shown in the graphs are dependent on the mass of ions. For example, the energy distribution pattern varies with the bias frequency as shown in FIG. 17(a) when chlorine gas is used as a processing gas, while the energy distribution pattern varies with the bias frequency as shown in FIG. 17(b) when hydrogen bromide gas is used as a processing gas, because the mass of xenon ions is greater than that of chlorine ions. Accordingly, when a processing gas consisting of a gas that produces ions having a comparatively small mass, such as chlorine gas, and a gas that produces ions having a comparatively large mass, such as xenon gas, is used and the bias frequency is fixed at $f_2$, the ion energy is distributed in a energy distribution pattern as shown in FIG. 18, which is a composite energy distribution pattern formed by composing two energy distribution patterns.

As regards etching rate, the etching rate with a p—Si film or the like increases from zero as the energy of the ions increases from 0 eV (FIG. 6), while the etching rate with a $SiO_2$ film or a resist film remains substantially zero when the energy of ions is equal to or less than the threshold ion energy $V_{th}$ and starts increasing when the energy of ions increases beyond the threshold ion energy $V_{th}$ (FIG. 7). Thus, the etch selectivity between those materials is greatly dependent on the energy of ions. An energy distribution pattern can be controlled with respect to the threshold ion energy $V_{th}$ as shown in FIG. 18 by adjusting the mixing ratio of the two-component processing gas and the bias frequency to use an optimum p—Si etching rate, an optimum etch selectivity relative to $SiO_2$ and an optimum etch selectivity relative to the resist. Processing conditions other than etching rate and etch selectivity, such as those relating to morphology and uniformity, can be optimized by selectively determining the bias frequency and the composition of the processing gas as mentioned above, which improves the total process performance.

In etching experiments, chlorine-xenon mixed processing gases respectively containing xenon gas in 0% (pure chlorine gas), 10% and 20% of chlorine gas were used and the bias frequency was varied in the range of 400 kHz to 1 MHz. The power of the microwave was 1 kW and the bias power was regulated according to processing conditions so that the p—Si etching rate was substantially constant.

In FIG. 19, curves 61, 62 and 63 show the dependence of the etch selectivity relative to $SiO_2$ on the bias frequency for xenon concentrations of 0%, 10% and 20%, respectively. Peak etch selectivities appeared at 600 kHz, 650 kHz and 700 kHz respectively on the curves 61, 62 and 63. The peak etch selectivity that appeared at a bias frequency of 650 kHz on the curve 62 for xenon concentration of 10% was the largest. In some bias frequency range, the etch selectivity when the chlorine-xenon mixed gas is used is smaller than the etch selectivity when chlorine gas is used, when the p—Si etching rate is kept constant, which shows the significance of bias frequency optimization. The tendency of variation of the etch selectivity relative to the resist film was similar to that of the etch selectivity relative to $SiO_2$.

With the substance of the present invention in view, it is apparent that means for producing a plasma need not be limited to a microwave; a helicon wave system or an inductive coupling system may be used for producing a plasma. An optimum combination of a bias frequency and a processing gas may be determined selectively according to purposes taking into consideration various plasma-processing conditions. The present invention is applicable also to etching an aluminum film.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A plasma processing apparatus comprising:
    a sample table for supporting thereon a workpiece having a substrate, a first layer formed over the surface of said substrate, and a second layer formed over said first layer on said substrate;
    a plasma generator for producing a plasma including ions; and
    RF bias power source means connected to said sample table for applying an RF bias voltage with a selectable frequency to said workpiece, the selectable frequency of the RF bias voltage being selected so that said plasma has two major ions in a space surrounding said workpiece mounted on said sample table, one major ion having energy capable of etching both said first and second layer, and another major ion having energy capable of etching said first layer and incapable of etching said second layer.

2. A plasma processing apparatus according to claim 1, wherein the selectable frequency of the RF bias voltage is in the range of 600 kHz to 1 MHz.

3. A plasma-processing apparatus according to claim 1, wherein the selectable frequency of the RF bias voltage is continuously variable.

4. A plasma processing method comprising the steps of:
    generating a plasma from a processing gas including a chlorine component for treating a workpiece having a substrate which is supported on a sample stand, a silicon dioxide film formed over the surface of said substrate, and a poly-silicon film formed over said silicon dioxide film on said substrate; and
    supplying an RF bias voltage with a selectable frequency to said workpiece on said sample table, the selectable frequency of the RF bias voltage being selected at a value between 550 kHz and 1 MHz;
    wherein the selectable frequency of the RF bias voltage is selected at a value of 600 kHz.

5. A plasma processing method comprising steps of:
    generating a plasma from a processing gas including a hydrogen bromide component for treating a workpiece having a substrate which is supported on a sample stand, a silicon dioxide film formed over the surface of said substrate, and a poly-silicon film formed over said silicon dioxide film on said substrate; and
    supplying an RF bias voltage with said workpiece on said sample table, a frequency of said RF bias voltage being selected at a value between 450 kHz and 600 kHz.

6. A plasma processing apparatus according to claim 5, wherein said frequency of said RF bias voltage is selected at a value of 500 kHz.

* * * * *